(12) United States Patent
Wu et al.

(10) Patent No.: US 11,653,516 B2
(45) Date of Patent: May 16, 2023

(54) ORGANIC ELECTROLUMINESCENT DEVICE, METHOD FOR FABRICATING THE SAME, AND LIGHT EMITTING APPARATUS

(71) Applicant: BOE TECHNOLOGY GROUP CO., LTD., Beijing (CN)

(72) Inventors: Changyen Wu, Beijing (CN); Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 594 days.

(21) Appl. No.: 16/334,456

(22) PCT Filed: May 11, 2018

(86) PCT No.: PCT/CN2018/086488
§ 371 (c)(1),
(2) Date: Mar. 19, 2019

(87) PCT Pub. No.: WO2018/205993
PCT Pub. Date: Nov. 15, 2018

(65) Prior Publication Data
US 2021/0305528 A1    Sep. 30, 2021

(30) Foreign Application Priority Data

May 12, 2017 (CN) .......................... 201710336049.8

(51) Int. Cl.
*H01L 51/50* (2006.01)

(52) U.S. Cl.
CPC ............. *H10K 50/13* (2023.02); *H10K 71/00* (2023.02); *H10K 71/164* (2023.02); *H10K 71/166* (2023.02)

(58) Field of Classification Search
CPC ... H01L 51/504; H01L 51/011; H01L 51/001; H01L 51/56; H01L 51/0011; H01L 51/156
See application file for complete search history.

(56) References Cited

U.S. PATENT DOCUMENTS

2002/0097001 A1* 7/2002 Jenekhe .............. H01L 51/5036
                                                   315/169.3
2005/0236981 A1* 10/2005 Cok .................... H01L 27/3213
                                                   313/504

(Continued)

FOREIGN PATENT DOCUMENTS

CN         1855524 A      11/2006
CN       101740607 A       6/2010

(Continued)

OTHER PUBLICATIONS

First Office Action for Chinese Patent Application No. 201710336049.8 dated Apr. 3, 2019.

(Continued)

*Primary Examiner* — Caridad Everhart
(74) *Attorney, Agent, or Firm* — Calfee, Halter & Griswold LLP

(57) ABSTRACT

An organic electroluminescent device, a method for fabricating the same, and a light emitting apparatus are disclosed. The organic electroluminescent device comprises a first light emitting layer and a second light emitting layer arranged on a surface of the first light emitting layer at a first side, and partially covers the surface of the first light emitting layer at the first side. Both the first and second light emitting layers are made from a material which has a larger mobility for a first carrier than a second carrier. Light emitting regions of the second light emitting layer and the regions of the first light emitting layer not covered by the second light emitting layer are configured to emit light of different colors at a (Continued)

preset light emitting ratio. A light emitting area ratio between a surface of each light emitting region and surfaces of the regions of the first light emitting layer not covered by the second light emitting layer is preset according to the preset light emitting ratio.

15 Claims, 3 Drawing Sheets

(56) References Cited

U.S. PATENT DOCUMENTS

| | | | |
|---|---|---|---|
| 2006/0231830 A1 | 10/2006 | Matsuda | |
| 2006/0238120 A1* | 10/2006 | Miller | H01L 27/322 |
| | | | 313/506 |
| 2007/0075310 A1 | 4/2007 | Lee | |
| 2009/0026943 A1* | 1/2009 | Yuki | H01L 51/5278 |
| | | | 313/505 |
| 2010/0117936 A1 | 5/2010 | Lhee et al. | |
| 2012/0199824 A1* | 8/2012 | Ichikawa | C07D 471/06 |
| | | | 257/40 |
| 2013/0140533 A1* | 6/2013 | Lee | H01L 27/3218 |
| | | | 257/40 |
| 2013/0168652 A1 | 7/2013 | Nam et al. | |
| 2014/0091289 A1 | 4/2014 | Heo et al. | |
| 2014/0235004 A1 | 8/2014 | Cho | |
| 2016/0197306 A1* | 7/2016 | Oskool | H01L 21/76817 |
| | | | 257/40 |
| 2016/0322583 A1* | 11/2016 | Kim | H01L 51/0054 |
| 2017/0012230 A1 | 1/2017 | Yan | |
| 2017/0040561 A1 | 2/2017 | Wu et al. | |
| 2018/0045953 A1* | 2/2018 | Fan | G02B 5/18 |
| 2018/0159068 A1* | 6/2018 | Lee | H01L 51/5237 |
| 2018/0190930 A1 | 7/2018 | Wu et al. | |

FOREIGN PATENT DOCUMENTS

| | | |
|---|---|---|
| CN | 103187429 A | 7/2013 |
| CN | 203325976 U | 12/2013 |
| CN | 103715224 A | 4/2014 |
| CN | 104617231 A | 5/2015 |
| CN | 105185917 A | 12/2015 |
| CN | 106058062 A | 10/2016 |
| CN | 107068886 A | 8/2017 |

OTHER PUBLICATIONS

Search Report and Written Opinion for International Application No. PCT/CN2018/086488 dated Aug. 21, 2018.

* cited by examiner

ORGANIC ELECTROLUMINESCENT DEVICE, METHOD FOR FABRICATING THE SAME, AND LIGHT EMITTING APPARATUS

RELATED APPLICATIONS

The present application is the U.S. national phase entry of PCT/CN2018/086488, with an international filing date of May 11, 2018, which claims the benefit of Chinese Patent Application No. 201710336049.8, filed on May 12, 2017, the entire disclosures of which are incorporated herein by reference.

TECHNICAL FIELD

The present disclosure relates to the field of organic electroluminescent technologies, and particularly to an organic electroluminescent device, a method for fabricating the same, and a light emitting apparatus.

BACKGROUND

An Organic Light Emitting Diode (OLED) is a self-luminous semiconductor device. As compared with a conventional light emitting device, the OLED has advantages of high brightness, low power consumption, quick response, wide operation temperature range, flexibility, capability of realizing a surface light source, and soft light. An OLED emits light under the mechanism that upon application of an external electric field, an electron and hole are injected from a cathode and an anode into an organic electroluminescent material respectively, so as to migrate in the organic electroluminescent material, and recombine to emit light.

SUMMARY

In a first aspect, an exemplary embodiment provides an organic electroluminescent device, comprising a first light emitting layer and a second light emitting layer, wherein the second light emitting layer is arranged on a surface of the first light emitting layer at a first side, and partially covers the surface of the first light emitting layer at the first side;

wherein both the first light emitting layer and the second light emitting layer are made from a material which has a larger mobility for a first carrier than a second carrier;

wherein the second light emitting layer comprises at least one light emitting region, each light emitting region of the second light emitting layer and regions of the first light emitting layer not covered by the second light emitting layer are configured to emit light of different colors at a preset light emitting ratio, and in each of the light emitting units of the organic electroluminescent device, a light emitting area ratio between a surface of each light emitting region and surfaces of the regions of the first light emitting layer not covered by the second light emitting layer is preset according to the preset light emitting ratio; and wherein a surface of the first light emitting layer at a second side is configured to receive the first carrier, and a surface of the second light emitting layer away from the first light emitting layer and the surfaces of the regions of the first light emitting layer not covered by the second light emitting layer are configured to receive the second carrier.

In an exemplary embodiment, each light emitting region of the second light emitting layer and the regions of the first light emitting layer not covered by the second light emitting layer are configured to emit light at the preset light emitting ratio, so that the emitted light is mixed into white light.

In an exemplary embodiment, the second light emitting layer comprises a first organic material layer and a second organic material layer, at least a portion of the first organic material layer forms a first light emitting region among the at least one light emitting region, and at least a portion of the second organic material layer forms a second light emitting region among the at least one light emitting region.

In an exemplary embodiment, the first organic material layer and the second organic material layer are arranged side by side on the surface of the first light emitting layer at the first side, and partially cover the surface of the first light emitting layer at the first side; and the first organic material layer forms the first light emitting region, and the second organic material layer forms the second light emitting region.

In an exemplary embodiment, the first organic material layer is arranged on the surface of the first light emitting layer at the first side, and partially covers the surface of the first light emitting layer at the first side;

the second organic material layer is arranged on a surface at a side of the first organic material layer away from the first light emitting layer, and partially covers the surface at the side of the first organic material layer away from the first light emitting layer; and a region of the first organic material layer not covered by the second organic material layer forms the first light emitting region, and the second organic material layer forms the second light emitting region.

In an exemplary embodiment, the second light emitting layer further comprises a third organic material layer, the third organic material layer and the first organic material layer are arranged side by side on the surface of the first light emitting layer at the first side, and the third organic material layer form a third light emitting region.

In an exemplary embodiment, in each of the light emitting units of the organic electroluminescent device, a light emitting area ratio between each light emitting region and the regions of the first light emitting layer not covered by the second light emitting layer is larger than 1.

In an exemplary embodiment, the first light emitting layer is an integral structure in the light emitting region of the organic electroluminescent device.

In an exemplary embodiment, the organic electroluminescent device further comprises a first electrode layer and a second electrode layer, wherein both the first light emitting layer and the second light emitting layer are arranged between the first electrode layer and the second electrode layer.

In an exemplary embodiment, the first electrode layer or the second electrode layer is an integral structure in the light emitting region of the organic electroluminescent device.

In an exemplary embodiment, the organic electroluminescent device further comprises:

a first carrier transport layer, which is arranged to contact the surface of the first light emitting layer at the second side;

a first carrier inject layer, which is arranged at a side of the first carrier transport layer away from the first light emitting layer;

a second carrier transport layer, which is arranged to contact the surface of the second light emitting layer away from the first light emitting layer and the surface of the first light emitting layer at the first side not covered by the second light emitting layer; and a second carrier inject layer, which is arranged at a side of the second carrier transport layer away from the second light emitting layer and the first light emitting layer.

In an exemplary embodiment, the first carrier is hole, and the second carrier is electron.

In another exemplary embodiment, the present disclosure further provides a light emitting apparatus comprising the organic electroluminescent device as described above.

In another exemplary embodiment, the present disclosure further provides a method for fabricating the organic electroluminescent device as described above. The method comprises forming the first light emitting layer and the second light emitting layer, wherein the second light emitting layer is arranged on the surface of the first light emitting layer at the first side, and partially covers the surface of the first light emitting layer at the first side. During forming the second light emitting layer, the method comprises:

by using a fine metal mask, forming organic material layers in sequence in each of the light emitting units which correspond to each light emitting region, wherein an opening ratio of each of the organic material layers is determined by a preset light emitting area ratio between the light emitting region to which said organic material layer corresponds and the surfaces of the regions of the first light emitting layer not covered by the second light emitting layer.

In potential exemplary embodiment, the method comprises forming the first light emitting layer by using an open mask.

In potential exemplary embodiment, forming the first light emitting layer and the second light emitting layer comprises: forming the first light emitting layer, and forming the second light emitting layer on the surface of the first light emitting layer at the first side.

In potential exemplary embodiment, forming the first light emitting layer and the second light emitting layer comprises: forming the second light emitting layer, and forming the first light emitting layer on the second light emitting layer.

BRIEF DESCRIPTION OF THE DRAWINGS

In order to explain the technical solutions in the embodiments of the present disclosure more clearly, the drawings to be used in the description of the embodiments will be introduced briefly in the following. Apparently, the drawings described below are only some embodiments of the present disclosure, a person with ordinary skill in the art, on the premise of not paying any creative work, can also obtain other drawings from these drawings.

DETAILED DESCRIPTION OF EMBODIMENTS

In order to make objects, technical solutions and advantages of the present disclosure more clear, exemplary embodiments of the present disclosure will be further described in detail hereinafter with reference to the accompanying drawings.

In application scenarios in which light from a plurality of organic electroluminescent materials is mixed to provide a mixed light with the desired color temperature or color, organic electroluminescent material layers of different colors in each of the light emitting units are generally arranged side by side, and the desired mixed light is obtained by e.g., adjusting the ratio of current for emitting light. Although this manner has advantages like a large adjustment range and flexible adjustment, the organic electroluminescent material layer of each color has to be formed by a fabricating process with very high accuracy requirement. As a result, the process is complicated and difficult, the yield of product is low, and the fabrication cost is high.

Exemplary Embodiments provide an organic electroluminescent device, a method for fabricating the same, and a light emitting apparatus, which can reduce accuracy requirement of the fabricating process in case of light mixing among a plurality of organic electroluminescent materials.

Figure 1:
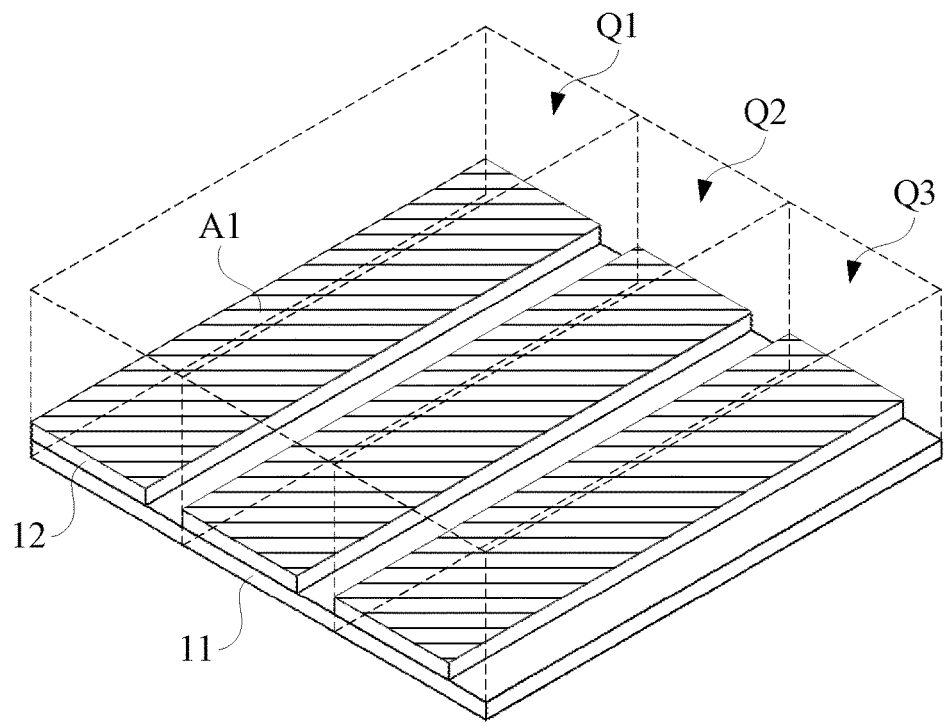
FIG. 1 is a structural view for illustrating an organic electroluminescent device in an exemplary embodiment.

FIG. 1 is a structural view for an organic electroluminescent device in an embodiment of the present disclosure. In the present embodiment, the organic electroluminescent device comprises several light emitting units, e.g. a light emitting unit Q1, a light emitting unit Q2 and a light emitting unit Q3 shown in FIG. 1, in order to realize light mixing among at least two organic electroluminescent materials according to a preset light emitting ratio. For example, in some implementations, the device is configured to realize light mixing between a yellow fluorescent material and a blue fluorescent material according to a preset light emitting ratio (i.e., luminous intensity ratio) of 2:1, so as to obtain white light with a corresponding color temperature. In other implementations, the device is configured to simulate the standard sunlight by using a plurality of organic electroluminescent materials, and it is required that each organic electroluminescent material emits light in a mixed manner at a certain preset light emitting ratio.

In the implementation shown in FIG. 1, the organic electroluminescent device in each of the light emitting units has the same structure. In another implementation, the organic electroluminescent device comprises at least two light emitting units with their respective different internal structure, and each of the light emitting units is arranged in the device by a certain rule. In another implementation, some light emitting units of the light emitting units have a different internal structure from that of other light emitting units, i.e., some light emitting units have a special internal structure with respect to other light emitting units. Embodiments of the present disclosure are not limited in this regard.

As shown in FIG. 1, elongated light emitting units are arranged in sequence in the same direction. In other implementations, the light emitting units can be arranged as needed into e.g., a shape like rectangle, triangle, square, trapezoid, circle, or oval in the two-dimensional plane according to any manner and are not limited in this regard.

As shown in FIG. 1, an organic electroluminescent device in the present embodiment comprises a first light emitting layer 11 and a second light emitting layer 12. The second light emitting layer 12 is arranged on a surface at a first side (e.g., an upper side in FIG. 1) of the first light emitting layer 11, and partially covers the surface of the first light emitting layer 11 at the first side. The second light emitting layer 12 partially covers the first light emitting layer 11 (or the surface at its first side) indicates that a projection of the second light emitting layer 12 onto a plane where the second light emitting layer 12 lies partially overlap a projection of the first light emitting layer 11 onto this plane. In the present exemplary embodiment, the second light emitting layer 12 comprises a light emitting region A1 which has a color of emitted light. A light emitting area ratio between the light emitting region A1 in each of the light emitting units and the first light emitting layer 11 is preset according to the preset light emitting ratio as described for the intended mixed light. Namely, there can be a one-to-one correspondence between the mixed light emitting ratio and the preset light emitting ratio, so as to enable the preset light emitting ratio to which the intended mixed light corresponds by only configuring the light emitting area ratio. In the organic electroluminescent device, a surface (e.g., a lower surface of the first light emitting layer 11 in FIG. 1 which is not shown due to shielding) of the first light emitting layer 11 at a second side (e.g., a lower side in FIG. 1) is configured to receive a first carrier. A surface at a side of second light emitting layer 12 away from the first light emitting layer 11 (e.g., a surface formed by the light emitting region A1 in FIG. 1) and a surface of the first light emitting layer 11 at the first side not covered by the second light emitting layer 12 are configured to receive the second carrier. For example, the first carrier is electron and the second carrier is hole, or vice versa.

As shown in FIG. 1, the second light emitting layer 12 is arranged on the surface of the first light emitting layer 11 at the first side. Namely, the second light emitting layer 12 is arranged on the first light emitting layer 11. However it is understood that this only intend to describe the relative position relationship between the first light emitting layer 11 and the second light emitting layer 12. In the structure of the organic electroluminescent device shown in FIG. 1, the first light emitting layer 11 can also be referred to as being arranged on the second light emitting layer 12. This also applies to the following exemplary embodiments which will be described with reference to the accompanying drawings.

In an exemplary embodiment, both the first light emitting layer 11 and the second light emitting layer 12 are made from a material which has a larger mobility for the first carrier than the second carrier. It is understood that both the first light emitting layer 11 and the second light emitting layer 12 of the organic electroluminescent device comprise an organic electroluminescent material, and the first light emitting layer 11 and the second light emitting layer 12 can be made from different materials. Thereby, the principles of light emitting for the organic electroluminescent device of the present embodiment are described as follow.

Figure 2:
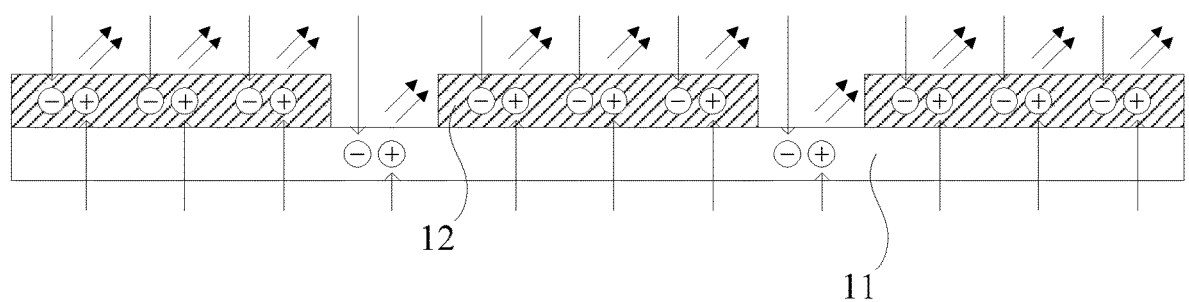
FIG. 2 is a schematic view for illustrating principles of light emitting for an organic electroluminescent device in an exemplary embodiment.

FIG. 2 is a schematic view for principles of light emitting for the organic electroluminescent device of the exemplary embodiment. In FIG. 2, reference is made to a case in which the first carrier is hole (shown by positive charge symbols in FIG. 2) and the second carrier is electron (shown by negative charge symbols in FIG. 2). As described above, both the first light emitting layer 11 and the second light emitting layer 12 are made from a material which has a larger mobility for the first carrier than the second carrier, so that the first light emitting layer 11 and the second light emitting layer 12 are apt to transport the first carrier more than the second carrier. In FIG. 2, the hole as the first carrier can migrate from the lower side to the first light emitting layer 11. Due to the nature of being apt to transport hole for the first light emitting layer 11, hole easily passes through the first light emitting layer 11 to arrive at the second light emitting layer 12. The electron as the second carrier can migrate from the upper side to the second light emitting layer 12 and uncovered regions of the first light emitting layer 11. Due to the nature of being not apt to transport electron for both light emitting layers, the electron is difficult to pass through the second light emitting layer 12 to arrive at the first light emitting layer 11. Thereby, as shown in FIGS. 1 and 2, the hole easily passes through the first light emitting layer 11 and recombines with the electron in the second light emitting layer 12 to emit light, while is difficult to recombine with the electron which passes through the second light emitting layer 12 so as to recombine in the first light emitting layer 11 to emit light. Thus, it is the second light emitting layer 12 that dominantly emits light in the light emitting region A1, while the covered regions of the first light emitting layer 11 primarily plays the role of transporting hole for the second light emitting layer 12. In contrast, beyond the light emitting region A1, the uncovered regions of the first light emitting layer 11 can receive electron and hole from both sides, so that electron and hole recombine in these portions of the first light emitting layer 11 to emit light. As a whole, the light emitted by the second light emitting layer 12 in the light emitting region A1 assumes the color of emitted light of the light emitting region A1, and the light emitted by the first light emitting layer 11 on the surface of uncovered regions the first side of the first light emitting layer 11 assumes the color of emitted light of the first light emitting layer 11. Thus, the preset light emitting area ratio between the light emitting region A1 and the first light emitting layer 11 is basically a ratio between an area of the light emitting region A1 in each of the light emitting units and an area of uncovered surface of the first light emitting layer 11 at the first side. During the fabrication of the organic electroluminescent device, this can be realized by applying an opening ratio corresponding to the above preset light emitting area ratio during fabricating corresponding organic material layers of the light emitting region A1.

For example, in FIGS. 1 and 2, the second light emitting layer 12 in each of the light emitting units occupies 75% of the area. Namely, a ratio between an area of the surface of the first light emitting layer 11 at the first side covered by the second light emitting layer 12 and an area of the uncovered surface of the first light emitting layer 11 at the first side is 3:1. Thereby, in case the organic material layer of the second light emitting layer 12 is formed by using e.g. a fine metal mask during fabricating the organic electroluminescent device, the opening ratio can be set to e.g. 75% or 25% (depending on parameters such as a positive photoresist or a negative photoresist), to realize the light emitting area ratio of 3:1 between the light emitting region A1 and the first light emitting layer 11, as shown in FIGS. 1 and 2. In case the light emitting region A1 comprises a yellow fluorescent material to emit yellow light, and the first light emitting layer 11 comprises a blue fluorescent layer to emit blue light, the yellow fluorescent material and the blue fluorescent material can emit light in a mixed manner at the preset light emitting ratio of 2:1, by only adjusting the light emitting area ratio between the light emitting region A1 and the first light emitting layer 11 (the mapping between the light emitting area ratio and the preset light emitting ratio can e.g. be obtained by actual tests on the device), while it is not necessary to adjust other structure parameters of the device.

In an exemplary application scenario, a yellow fluorescent material and a blue fluorescent material are used to fabricate a white light organic electroluminescent device mainly for illumination purpose. As for the lighting device, products of different color temperatures are applied in different application scenarios. For example, white light of a low color temperature (reddish) is preferred in Europe, and white light of high color temperature (bluish) is preferred in Asia. Similarly, in different product design scenarios, different specifications for the color temperature of white light are required. Thus, for manufacturers of this kind of organic electroluminescent device, it is desired that the processes for fabricating white light products of different color temperature specifications are similar as much as possible, so that the color temperature specification of the product can be flexibly adjusted, and the additional increase in production cost due to difference in color temperature specification is decreased. At the same time, it is desired to adopt a fabricating flow which is low in operation difficulty as much as possible, so as to decrease the production cost due to factors like expense production apparatus, expense production material, and low yield.

In an organic electroluminescent device of a comparative example, a hole transport layer, a yellow fluorescent material layer, a blue fluorescent material layer, and an electron transport layer are arranged layer by layer in the thickness direction. By adjusting parameters like the thickness and material ratio between the yellow fluorescent material layer and the blue fluorescent material layer, the desired color temperature can be realized, i.e., the yellow light and the blue light are mixed in the direction perpendicular to the light exit surface into a white light with the desired color temperature. On basis of this, in the present comparative example, both the yellow fluorescent material layer and the blue fluorescent material layer can be formed in the light emitting region of the device on a full surface by an open mask with very low process difficulty, and the process difficulty is significantly reduced as compared with the fine metal mask. However, in the present comparative example, as for products of different color temperature specifications, many parameters relevant with the thickness and the material ratio of the organic material layer have to be adjusted adaptively, i.e., it is required to develop a respective process recipe for the product of each color temperature specification. As a result, the fabricating process has to be performed separately according to each set of process recipe, and the color temperature can not be adjusted during the fabricating process.

In the organic electroluminescent device of another comparative example, the yellow fluorescent material layer and the blue fluorescent material layer is arranged in a same layer between the electron transport layer and the hole transport layer, the area ratio between the yellow fluorescent material layer and the blue fluorescent material layer in each of the light emitting units determines the desired color temperature, i.e., the yellow light and the blue light are mixed in the direction parallel to the light exit surface into white light of the desired color temperature. On basis of this, the present comparative example enables products of different color temperature specifications to be realized by fine metal masks of different specifications, while parameters like layer thickness, material ratio can be completely the same, i.e., it is not necessary to design different process recipes for each color temperature specification, and adjustment in color temperature can be realized by a change in specification of the fine metal mask. However, in the present comparative example, the fine metal mask is used for two times to form the yellow fluorescent material layer and the blue fluorescent material layer at different positions, and a very high process accuracy is required for the material layer with a relatively small footprint due to its small size, so that the process difficulty is very high.

As can be seen from the above two comparative examples, horizontal light mixing and vertical light mixing suffer from the drawback of high process difficulty and the drawback of difficulty in adjusting color temperature, respectively, so that neither of them can satisfy actual needs in the application scenarios as described above.

For example, in the exemplary embodiment of an organic electroluminescent device shown in FIG. 1, the first light emitting layer 11 is particularly the above described the blue fluorescent material layer, and the second light emitting layer 12 is particularly the yellow fluorescent material layer. According to the principles of light emitting shown in FIG. 2, in the present example, the occupied area ratio of the yellow fluorescent material layer in each of the light emitting units determines the mixing ratio between yellow light and blue light, i.e., there can be a one-to-one correspondence between the above preset light emitting area ratio and the desired color temperature, so that it is not necessary to design different process recipes for each color temperature specification, and adjustment of color temperature can be realized by only changing the opening ratio for the yellow fluorescent material layer. Besides, the blue fluorescent material layer in the present example can be formed in the light emitting region of the device on a full surface by an open mask with very low process difficulty, while the yellow fluorescent material layer can be formed by a fine metal mask with less high accuracy requirement due to its relatively large size, so that the process difficulty is low.

It is apparent from comparison with the two comparative examples that, the above exemplary embodiments can not only satisfy two needs about process difficulty and color temperature adjustment in the above described application scenarios, and a solution for an organic electroluminescent device for illumination purpose with a low production cost is provided. It can be seen that, exemplary embodiments can reduce the accuracy requirement of fabricating process in case a plurality of organic electroluminescent materials are used for light mixing. This facilitates reducing the process difficulty and increasing yield of product and can simplify the process for adjusting the mixing ratio.

Figure 3:
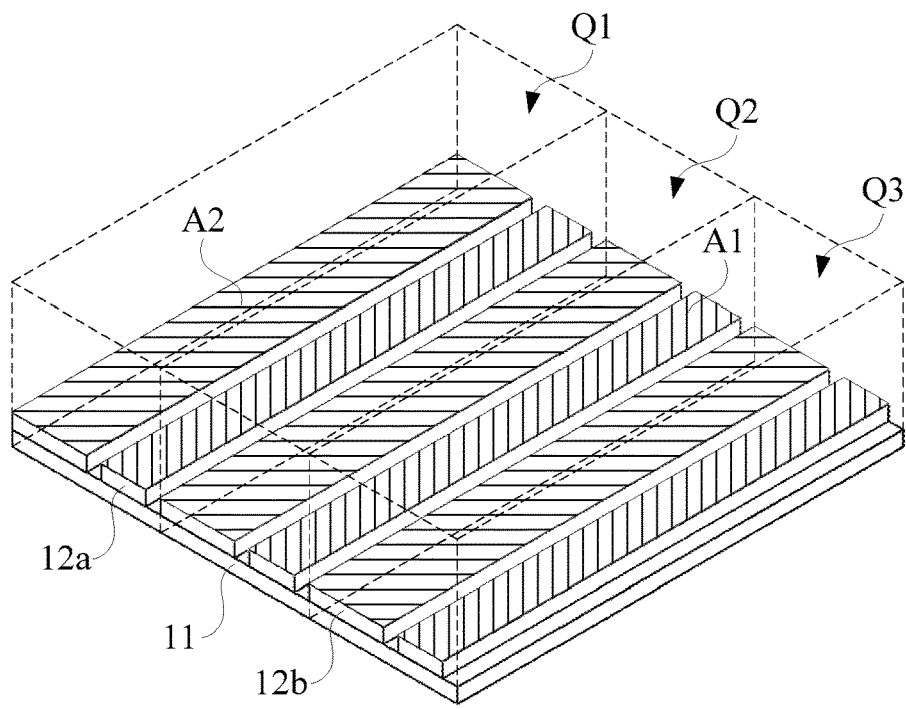
FIG. 3 is a structural view for illustrating an organic electroluminescent device in an exemplary embodiment.

FIG. 3 is a structural view for an organic electroluminescent device in another exemplary embodiment. As shown in FIG. 3, the organic electroluminescent device of the present embodiment comprises the first light emitting layer 11 and the second light emitting layer 12. In the present embodiment, the second light emitting layer 12 comprises a first light emitting region A1 and a second light emitting region A2. The first light emitting region A1 and the second light emitting region A2 have a respective color of emitted light. In each of the light emitting units, the first light emitting region A1 and the second light emitting region A2 have a respective preset light emitting area ratio with respect to the first light emitting layer 11. In the present exemplary embodiment, the second light emitting layer 12 comprises a first organic material layer 12a and a second organic material layer 12b. At least a portion of the surface of the first organic material layer 12a (e.g., at least a portion of the surface at the upper side in FIG. 3) forms the first light emitting region A1. At least a portion of the surface of the second organic material layer 12b (e.g., at least a portion of the surface at the upper side in FIG. 3) forms the second light emitting region A2. The first organic material layer 12a and the second organic material layer 12b are arranged side by side on the surface of the first light emitting layer 11 at the first side, and partially cover the surface of the first light emitting layer 11 at the first side. In addition, both the first light emitting layer 11 and the second light emitting layer 12 are made from a material which has a larger mobility for the first carrier than the second carrier. The surface of the first light emitting layer 11 at the second side is configured to receive the first carrier. The surface at a side of the second light emitting layer 12 away from the first light emitting layer 11 and the surface of the first light emitting layer 11 at the first side not covered by the second light emitting layer 12 is configured to receive the second carrier.

Referring to the principles of light emitting shown in FIG. 2, in the present exemplary embodiment, the regions of the first light emitting layer 11 which are covered in the first light emitting region A1 and the second light emitting region A2 primarily play the role of transporting the first carrier for the second light emitting layer 12, while it is the second light emitting layer 12 that dominantly emits light. Namely, electron (the second carrier) in the first light emitting region A1 primarily recombines hole (the first carrier) in the first organic material layer 12a to emit light, electron in the second light emitting region A2 primarily recombines with hole in the second organic material layer 12b to emit light, while the uncovered regions of the first light emitting layer 11 can emit light by recombining carriers which are received at both sides. In each of the light emitting units, an area ratio among the first organic material layer 12a, the second organic material layer 12b and the uncovered regions of the first light emitting layer 11 is determined by the preset light emitting area ratio between the first light emitting region A1 and the first light emitting layer 11 and the preset light emitting area ratio between the second light emitting region A2 and the first light emitting layer 11.

For example, in FIG. 3, the light emitting area ratio between the first light emitting region A1 and the first light emitting layer 11 in each of the light emitting units is preset to 3:2, and the light emitting area ratio between the second light emitting region A2 and the first light emitting layer 11 in each of the light emitting units is preset to 5:2. In this way, the opening ratio of the first organic material layer 12a can be set in the fabricating process so that the occupied area ratio of the first organic material layer 12a in each of the light emitting units is 30%, and the opening ratio of the second organic material layer 12b can be set so that the occupied area ratio of the second organic material layer 12b in each of the light emitting units is 50%, so as to form the shape and structure shown in FIG. 3. As described above, the light emitting area of the first light emitting layer 11 as used herein indicates the area of the surface of the first light emitting layer 11 at the first side which is covered by neither the first organic material layer 12a nor the second organic material layer 12b.

As can be seen, in exemplary embodiments, there is no need to apply a fabricating process of high accuracy for forming the first light emitting layer, in the application scenario in which light is mixed among three organic electroluminescent materials. Thus, the process difficulty can be reduced, the yield of product can be increased, and the process for adjusting the mixing ratio can be simplified.

Figure 4:
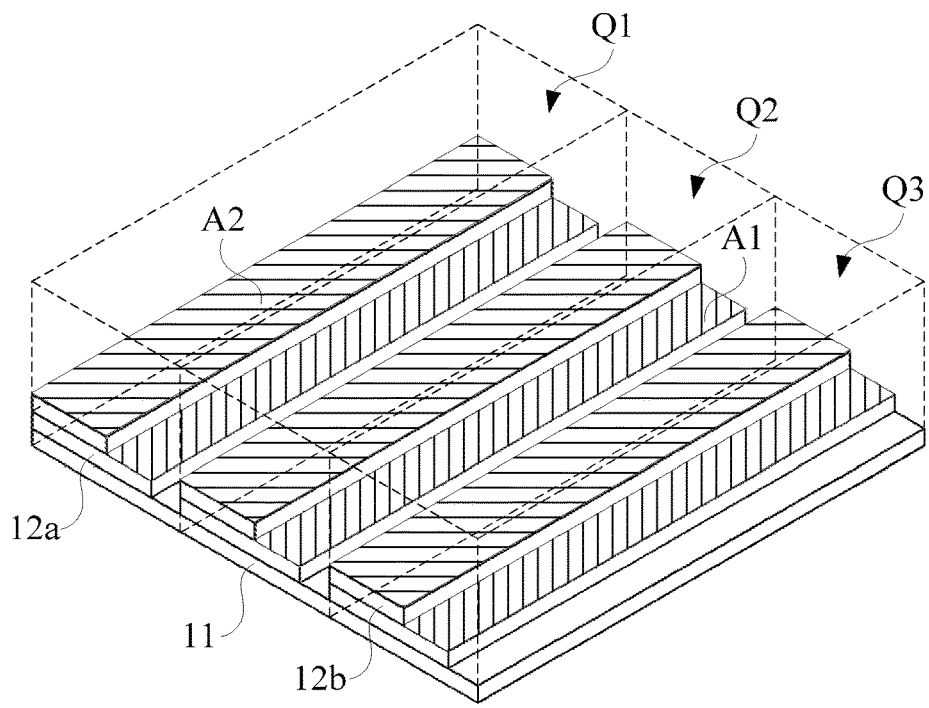
FIG. 4 is a structural view for illustrating an organic electroluminescent device in an exemplary embodiment.

FIG. 4 is a structural view for an organic electroluminescent device in another exemplary embodiment. As shown in FIG. 4, the organic electroluminescent device of the present embodiment comprises the first light emitting layer 11 and the second light emitting layer 12. In the present embodiment, the second light emitting layer 12 comprises the first light emitting region A1 and the second light emitting region A2. The first light emitting region A1 and the second light emitting region A2 have a respective color of emitted light. In each of the light emitting units, each of the first light emitting region A1 and the second light emitting region A2 has a preset light emitting area ratio with respect to the first light emitting layer 11. In the present exemplary embodiment, the second light emitting layer 12 comprises the first organic material layer 12a and the second organic material layer 12b. At least a portion of the surface of the first organic material layer 12a forms the first light emitting region A1, and at least a portion of the surface of the second organic material layer 12b forms the second light emitting region A2. The first organic material layer 12a is arranged on the surface of the first light emitting layer 11 at the first side, and partially covers the surface of the first light emitting layer 11 at the first side. The second organic material layer 12b is arranged on the surface at a side of the first organic material layer 12a away from the first light emitting layer 11, and partially covers the surface at a side of the first organic material layer 12a away from the first light emitting layer 11. In addition, both the first light emitting layer 11 and the second light emitting layer 12 are made from a material which has a larger mobility for the first carrier than the second carrier. The surface of the first light emitting layer 11 at the second side is configured to receive the first carrier. The surface at the side of the second light emitting layer 12 away from the first light emitting layer 11 and the surface of the first side of the first light emitting layer 11 not covered by the second light emitting layer 12 are configured to receive the second carrier.

Referring to the principles of light emitting shown in FIG. 2, in the present exemplary embodiment, the regions of the first light emitting layer 11 which are covered in the first light emitting region A1 and the second light emitting region A2 primarily play the role of transporting the first carrier for the first organic material layer 12a, while the first organic material layer 12a which is covered in the first light emitting region A1 primarily plays the role of transporting the first carrier for the second organic material layer 12b. Namely, electrons in the first light emitting region A1 primarily recombine with holes in the first organic material layer 12a to emit light, electrons in the second light emitting region A2 primarily recombine with holes in the second organic material layer 12b to emit light, while the uncovered regions of the first light emitting layer 11 can emit light by recombining carriers which are received at both sides. In each of the light emitting units, the area ratio among the first organic material layer 12a, the second organic material layer 12b and the uncovered regions of the first light emitting layer 11 is determined by the preset light emitting area ratio between the first light emitting region A1 and the first light emitting layer 11 and the preset light emitting area ratio between the second light emitting region A2 and the first light emitting layer 11.

For example, in FIG. 4, the light emitting area ratio between the first light emitting region A1 and the first light emitting layer 11 in each of the light emitting units is preset to 3:2, and the light emitting area ratio between the second light emitting region A2 and the first light emitting layer 11 in each of the light emitting units is preset to 5:2. In this way, the opening ratio of the first organic material layer 12a can be set in the fabricating process so that the occupied area ratio of the first organic material layer 12a in each of the light emitting units is 80%, and the opening ratio of the second organic material layer 12b can be set so that the occupied area ratio of the second organic material layer 12b in each of the light emitting units is 50%, so as to form the shape and structure shown in FIG. 4. As described above, the light emitting area of the first light emitting layer 11 as used herein indicates the area of the surface of the first light emitting layer 11 at the first side which is covered by the first organic material layer 12a.

As can be seen, in exemplary embodiments, there is no need to apply a fabricating process of high accuracy for forming the first light emitting layer, in the application scenario in which light is mixed among three organic electroluminescent materials. Thus, the process difficulty can be reduced, the yield of product can be increased, and the process for adjusting the mixing ratio can be simplified. In addition, as compared with the device shown in FIG. 3, the device shown in FIG. 4 can further reduce the accuracy requirement during the process for fabricating the first organic material layer 12a, further reduce the process difficulty, and further increase the yield of product.

By taking the organic electroluminescent device shown in FIGS. 3 and 4 as an example, in an application scenario in which light is mixed among n (n>1) types of organic electroluminescent materials, the second light emitting layer can comprise n−1 light emitting regions, wherein each light emitting region has a respective color of emitted light. In each of the light emitting units, each light emitting region has a respective preset light emitting area ratio with respect to the first light emitting layer. Thereby, the process difficulty can be reduced in an application scenario in which light is mixed among any number of organic electroluminescent materials. Further, n−1 light emitting regions can be formed respectively by at least a portion of the surface of an organic material layer. Any two organic material layers can be arranged side by side on a same layer structure as shown in FIG. 3, arranged in a stacked manner as shown in FIG. 4, or arranged in any combined manner.

Figure 6:
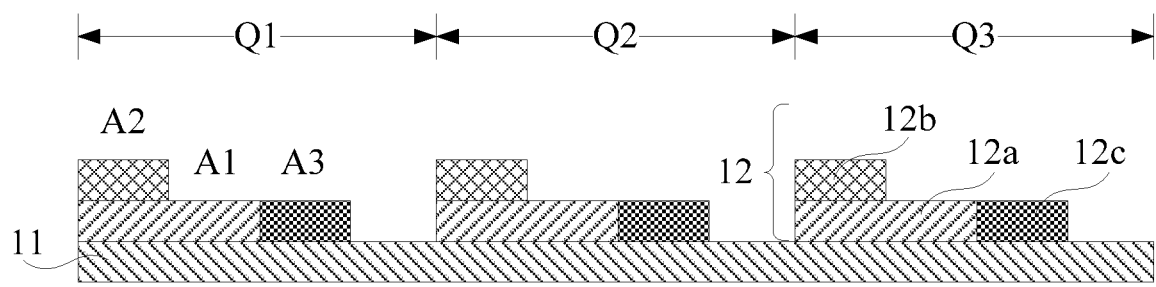
FIG. 6 is a cross-sectional view for illustrating an organic electroluminescent device in an exemplary embodiment.

For example, a possible combination is shown in FIG. 6. As shown, in each of the light emitting units, the organic electroluminescent device comprises the first light emitting layer 11 and the second light emitting layer 12. The second light emitting layer 12 comprises the first light emitting region A1, the second light emitting region A2 and a third light emitting region A3. The first light emitting region A1, the second light emitting region A2 and the third light emitting region A3 have a respective color of emitted light. In each of the light emitting units, the first light emitting region A1, the second light emitting region A2 and the third light emitting region A3 have a respective preset light emitting area ratio with respect to the first light emitting layer 11. In the present exemplary embodiment, the second light emitting layer 12 comprises the first organic material layer 12a, the second organic material layer 12b and a third organic material layer 12c. At least a portion of the surface of the first organic material layer 12a forms the first light emitting region A1, at least a portion of the surface of the second organic material layer 12b forms the second light emitting region A2, and at least a portion of the surface of the third organic material layer 12c forms the third light emitting region A3. The present exemplary embodiment differs from the exemplary embodiment of FIG. 4 in that, in the present exemplary embodiment, the third organic material layer 12c and the first organic material layer 12a are arranged side by side on the surface of the first light emitting layer 11 at the first side. In the organic electroluminescent device of the present exemplary embodiment, the second light emitting layer 12 comprises three light emitting regions. These three light emitting regions and the surface of the first light emitting layer 11 which is not covered by the second light emitting layer 12 are combined to realize light mixing among four organic electroluminescent materials.

In the organic electroluminescent device of the above examples, the light mixing comprises, but not limited to, mixing of colors. In an exemplary implementation, the color of emitted light for each light emitting region is different from that of the first light emitting layer, so that color mixing between the first light emitting layer and the second light emitting layer can be realized by the above organic electroluminescent devices. The color of emitted light comprises, but not limited to red, yellow, green, blue, violet, pink, brown and white. The purpose of color mixing comprises, but not limited to, obtaining the desired color or spectrum of emitted light, adjusting the color temperature, improving the color purity, and simulating the standard natural light spectrum. In other implementations, any light emitting region can have a same color of emitted light as the first light emitting layer, so as to adaptively realize the desired light mixing effect.

In the organic electroluminescent device of the above examples, the respective preset light emitting area ratio between each light emitting region and the first light emitting layer in each of the light emitting units can be set to be larger than 1. For example, in FIGS. 1, 3 and 4, the light emitting area proportion of the first light emitting layer 11 is smaller than that of each light emitting region. In this way, as compared with the case in which the first light emitting layer has a light emitting area proportion larger than that of the light emitting regions, the organic light emitting layer in the second light emitting layer can have a larger size. This facilitates reducing the accuracy requirement in the fine metal mask, and further reducing the process difficulty.

In the organic electroluminescent device of the above examples, the first light emitting layer in the light emitting regions of the organic electroluminescent device can be an integral structure. For example, in FIGS. 1, 3 and 4, the first light emitting layer 11 is an integral structure in all light emitting units. On basis of this, the first light emitting layer can be formed by the open mask, which further reduces the process difficulty.

Figure 5:
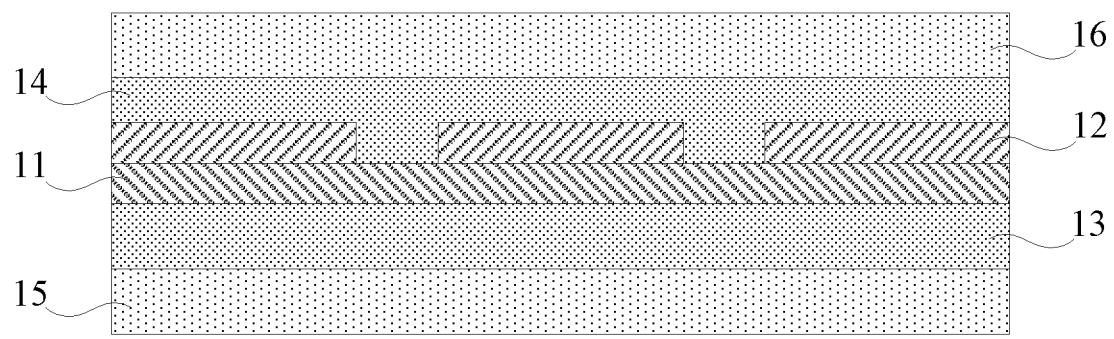
FIG. 5 is a cross-sectional view for illustrating an organic electroluminescent device in an exemplary embodiment.

FIG. 5 is a cross-sectional view for an organic electroluminescent device in another exemplary embodiment. As shown in FIG. 5, the organic electroluminescent device of the exemplary embodiment comprises the first light emitting layer 11 and the second light emitting layer 12, and further comprises:

a first carrier transport layer 13 which is configured to transport the first carrier, wherein the first carrier transport layer 13 is arranged to contact the surface of the first light emitting layer 11 at the second side. The first carrier transport layer 13 can be an electron transport layer (ETL) or a hole transport layer (HTL) which is made from any suitable material;

a second carrier transport layer 14 which is configured to transport the second carrier, wherein the second carrier transport layer 14 is arranged to contact the surface of the second light emitting layer 12 at a side away from the first light emitting layer 11 and the surface of the first side of the first light emitting layer 11 which is not covered by the second light emitting layer 12. The second carrier transport layer 14 can be an electron transport layer or a hole transport layer which is made from any suitable material;

a first carrier inject layer 15 which is configured to inject the first carrier, wherein the first carrier inject layer 15 is arranged at a side of the first carrier transport layer 13 away from the first light emitting layer 11. The first carrier inject layer 15 can be a hole inject layer (HIL) or an electron inject layer (EIL) which is made from any suitable material; and a second carrier inject layer 16 which is configured to inject the second carrier, wherein the second carrier inject layer 16 is arranged at a side of the second carrier transport layer 14 away from the second light emitting layer and the first light emitting layer. The second carrier inject layer 16 can be a hole inject layer or an electron inject layer which is made from any suitable material.

In addition, a first electrode layer and a second electrode layer which can be made from e.g. a metal or a conductive material like indium tin oxide (ITO), can further be arranged on the structure shown in FIG. 5, so that both the first light emitting layer 11 and the second light emitting layer 12 are arranged between the first electrode layer and the second electrode layer. For example, the first electrode layer is arranged at the side of the second carrier inject layer 16 away from the second light emitting layer 12, and the second electrode layer is arranged at the side of the first carrier inject layer 15 away from the first light emitting layer 11. In this way, two electrode layers can be connected with two terminals of a power source, respectively, so as to enable the device to emit light. In an implementation, the first electrode layer or the second electrode layer can be an integral structure in the light emitting region of the organic electroluminescent device, so that the first carrier or the second carrier can be provided for the first light emitting layer and the second light emitting layer, uniformly in all light emitting regions. In another implementation, the device per se does not comprise any electrode layer, but can receive carriers through a conductive surface of another apparatus.

It is understood that the structure of the organic electroluminescent device in the present embodiment is only an example of the manner in which the first carrier and the second carrier are provided to the first light emitting layer and the second light emitting layer. A device structure through which the carrier is provided in other manner as needed can further be envisioned.

Based on the same inventive concept, exemplary embodiments provide a method for fabricating the above organic electroluminescent device, comprising: forming the first light emitting layer, and forming the second light emitting layer on the surface of the first light emitting layer at the first side; or, forming the second light emitting layer, and forming the first light emitting layer on the second light emitting layer. Forming the second light emitting layer comprises: by using a fine metal mask, forming organic material layers in sequence in each of the light emitting units which correspond to each light emitting region, wherein an opening ratio of each of the organic material layers is determined by a preset light emitting area ratio between the light emitting region to which said organic material layer corresponds and the first light emitting layer. The method of the exemplary embodiment comprises steps which correspond to the structure of the organic electroluminescent device. For example, as for the structure of FIG. 5, the method comprises steps of forming in sequence the first carrier inject layer 15, the first carrier transport layer 13, the first light emitting layer 11, the second light emitting layer 12, the second carrier transport layer 14 and the second carrier inject layer 16. As for the structure shown in FIG. 4, forming the second light emitting layer particularly comprises: by using a fine metal mask, forming in sequence the first organic material layer 12a and the second organic material layer 12b on the surface of the first light emitting layer at the first side. The method is not limited to the above steps. It can be seen that the above organic electroluminescent device can be fabricated by the method in embodiments of the present disclosure. As compared with the existing method, the method enables a lower process difficulty and a higher yield, and flexible adjustment of the mixing ratio.

Based on the same inventive concept, exemplary embodiments provide a light emitting apparatus, comprising the above organic electroluminescent device. In an implementation, the light emitting apparatus can be display device, such as a product or component with a display function like a display panel, a mobile phone, a tablet computer, a TV set, a monitor, a notebook computer, a digital phone frame, a navigator. In another implementation, the light emitting apparatus is a lighting device, such as a product or component with an illumination function like a backlight, a table lamp, a ceiling lamp, a wall lamp, a flash light. It can be seen that, based on the features of low process difficulty, high yield, flexible adjustment of mixing ratio for the organic electroluminescent device, the light emitting apparatus in exemplary embodiments has corresponding beneficial effects, and facilitates a lower product cost.

As can be seen from the above technical solutions, on basis of arrangement relationship between the second light emitting layer and the first light emitting layer, the second light emitting layer of the present disclosure can block the second carrier from entering the first light emitting layer, so that the covered portion of the first light emitting layer does not emit light, while the uncovered portion of the first light emitting layer has a preset light emitting area ratio with respect to each light emitting region of the second light emitting layer. In this way, there is no need to apply a fabricating process of high accuracy for forming the first light emitting layer, to provide an equivalent light mixing effect. Thus, the process difficulty can be reduced, and the yield of product can be increased. In addition, adjustment of mixing ratio can be realized by simply changing the opening ratio of the organic material layer, and it is not necessary to design different process recipes for different mixing ratios. Namely, the process for adjusting the mixing ratio is simplified.

It will be understood that the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An organic electroluminescent device, comprising a first light emitting layer and a second light emitting layer, the first light emitting layer and the second light emitting layer being in direct contact,
   wherein the second light emitting layer is arranged on a surface of the first light emitting layer at a first side, and partially covers the surface of the first light emitting layer at the first side;
   wherein both the first light emitting layer and the second light emitting layer are made from a material which has a larger mobility for a first carrier than a second carrier;
   wherein the second light emitting layer comprises at least one light emitting region, each light emitting region of the second light emitting layer and regions of the first light emitting layer not covered by the second light emitting layer are configured to emit light of different colors at a preset light emitting ratio, light emitted from an overlapping area of the first light emitting layer and the second light emitting layer presents a light emitting color of the light emitting region of the second light emitting layer, and in each of the light emitting units of the organic electroluminescent device, a light emitting area ratio between a surface of each light emitting region and surfaces of the regions of the first light emitting layer not covered by the second light emitting layer is preset according to the preset light emitting ratio;

wherein the second light emitting layer comprises a first organic material layer and a second organic material layer, at least a portion of the first organic material layer forms a first light emitting region among the at least one light emitting region, and at least a portion of the second organic material layer forms a second light emitting region among the at least one light emitting region;

wherein a surface of the first light emitting layer at a second side is configured to receive the first carrier, and a surface of the second light emitting layer away from the first light emitting layer and the surfaces of the regions of the first light emitting layer not covered by the second light emitting layer are configured to receive the second carrier; and wherein the first light emitting layer covers at least two adjacent light emitting units and the area between the adjacent at least two light emitting units, the adjacent light emitting units are respectively covered by the corresponding second light emitting layer, and the second light emitting layer is disconnected in the area between the adjacent light emitting units.

2. The organic electroluminescent device of claim 1, wherein each light emitting region of the second light emitting layer and the regions of the first light emitting layer not covered by the second light emitting layer are configured to emit light at the preset light emitting ratio, so that the emitted light is mixed into white light.

3. The organic electroluminescent device of claim 1, wherein the first organic material layer and the second organic material layer are arranged side by side on the surface of the first light emitting layer at the first side, and partially cover the surface of the first light emitting layer at the first side; and wherein the first organic material layer forms the first light emitting region, and the second organic material layer forms the second light emitting region.

4. The organic electroluminescent device of claim 1, wherein the first organic material layer is arranged on the surface of the first light emitting layer at the first side, and partially covers the surface of the first light emitting layer at the first side;

wherein the second organic material layer is arranged on a surface at a side of the first organic material layer away from the first light emitting layer, and partially covers the surface at the side of the first organic material layer away from the first light emitting layer; and wherein a region of the first organic material layer not covered by the second organic material layer forms the first light emitting region, and the second organic material layer forms the second light emitting region.

5. The organic electroluminescent device of claim 4, wherein the second light emitting layer further comprises a third organic material layer, the third organic material layer and the first organic material layer are arranged side by side on the surface of the first light emitting layer at the first side, and the third organic material layer form a third light emitting region.

6. The organic electroluminescent device of claim 1, wherein in each of the light emitting units of the organic electroluminescent device, a light emitting area ratio between each light emitting region and the regions of the first light emitting layer not covered by the second light emitting layer is larger than 1.

7. The organic electroluminescent device of claim 1, wherein the first light emitting layer is an integral structure in the light emitting region of the organic electroluminescent device.

8. The organic electroluminescent device of claim 1, further comprising a first electrode layer and a second electrode layer, wherein both the first light emitting layer and the second light emitting layer are arranged between the first electrode layer and the second electrode layer.

9. The organic electroluminescent device of claim 8, wherein the first electrode layer or the second electrode layer is an integral structure in the light emitting region of the organic electroluminescent device.

10. The organic electroluminescent device of claim 1, further comprising:
a first carrier transport layer, which is arranged to contact the surface of the first light emitting layer at the second side;
a first carrier inject layer, which is arranged at a side of the first carrier transport layer away from the first light emitting layer;
a second carrier transport layer, which is arranged to contact the surface of the second light emitting layer away from the first light emitting layer and the surface of the first light emitting layer at the first side not covered by the second light emitting layer; and
a second carrier inject layer, which is arranged at a side of the second carrier transport layer away from the second light emitting layer and the first light emitting layer.

11. The organic electroluminescent device of claim 1, wherein the first carrier is hole, and the second carrier is electron.

12. A light emitting apparatus, comprising the organic electroluminescent device of claim 1.

13. A method for fabricating the organic electroluminescent device of claim 1, comprising: forming the first light emitting layer and the second light emitting layer, wherein the second light emitting layer is arranged on the surface of the first light emitting layer at the first side, and partially covers the surface of the first light emitting layer at the first side;

wherein during forming the second light emitting layer, the method comprises:
by using a fine metal mask, forming organic material layers in sequence in each of the light emitting units which correspond to each light emitting region, wherein an opening ratio of each of the organic material layers is determined by a preset light emitting area ratio between the light emitting region to which said organic material layer corresponds and the surfaces of the regions of the first light emitting layer not covered by the second light emitting layer.

14. The method of claim 13, comprising forming the first light emitting layer by using an open mask.

15. The organic electroluminescent device of claim 1, wherein a ratio between an area of the surface of the first light emitting layer at the first side covered by the second light emitting layer and an area of the uncovered surface of the first light emitting layer at the first side is 3:1; the first light emitting layer is a blue fluorescent material layer, and the second light emitting layer is a yellow fluorescent material layer.

* * * * *